(12) United States Patent
Yue et al.

(10) Patent No.: US 12,550,442 B2
(45) Date of Patent: Feb. 10, 2026

(54) DISPLAY BACK PLATE AND DISPLAY DEVICE

(71) Applicant: BOE Technology Group Co., Ltd., Beijing (CN)

(72) Inventors: Yang Yue, Beijing (CN); Shi Shu, Beijing (CN); Qi Yao, Beijing (CN); Yong Yu, Beijing (CN); Xiang Li, Beijing (CN); Chuanxiang Xu, Beijing (CN); Shaohui Li, Beijing (CN); Shipei Li, Beijing (CN); Wenqu Liu, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 393 days.

(21) Appl. No.: 18/027,131

(22) PCT Filed: Apr. 29, 2022

(86) PCT No.: PCT/CN2022/090354
§ 371 (c)(1),
(2) Date: Mar. 20, 2023

(87) PCT Pub. No.: WO2023/206381
PCT Pub. Date: Nov. 2, 2023

(65) Prior Publication Data
US 2024/0347543 A1 Oct. 17, 2024

(51) Int. Cl.
*H10D 86/60* (2025.01)
*H01L 25/16* (2023.01)
*H10D 86/40* (2025.01)

(52) U.S. Cl.
CPC .......... *H10D 86/60* (2025.01); *H01L 25/167* (2013.01); *H10D 86/441* (2025.01); *H10D 86/451* (2025.01)

(58) Field of Classification Search
None
See application file for complete search history.

(56) References Cited

U.S. PATENT DOCUMENTS 10,916,615 B1 2/2021 Hu et al.
2018/0373368 A1 12/2018 Zheng et al.
(Continued)

FOREIGN PATENT DOCUMENTS

CN 206258846 U 6/2017
CN 108305881 A 7/2018
(Continued)

*Primary Examiner* — Bo B Jang
(74) *Attorney, Agent, or Firm* — Ling Wu; Stephen Yang; Ling and Yang Intellectual Property

(57) ABSTRACT

A display back plate and a display device are provided. The display back plate includes multiple display units on a base substrate, at least one display unit includes a pixel region for displaying image and a light transmissive region allowing light to transmit; the pixel region includes a first trace layer and a second trace layer disposed in different layers along a thickness direction of the base substrate; and the pixel region further includes a first dielectric layer and a second dielectric layer between the first trace layer and the second trace layer, a ratio of a thickness of the first trace layer to that of the second trace layer is greater than 5; a sum of a thickness of the first dielectric layer and a thickness of the second dielectric layer is greater than 3 μm, and the thickness of the first dielectric layer is less than 2 μm.

20 Claims, 6 Drawing Sheets

(56) References Cited

U.S. PATENT DOCUMENTS

| | | |
|---|---|---|
| 2020/0168639 A1 | 5/2020 | Yu et al. |
| 2021/0273205 A1 | 9/2021 | Lee et al. |
| 2021/0296406 A1 | 9/2021 | Fang et al. |
| 2022/0085122 A1 | 3/2022 | Fu et al. |
| 2022/0131111 A1 | 4/2022 | Lee et al. |
| 2022/0359638 A1 | 11/2022 | Zhang et al. |

FOREIGN PATENT DOCUMENTS

| | | |
|---|---|---|
| CN | 110112146 A | 8/2019 |
| CN | 110265454 A | 9/2019 |
| CN | 110767738 A | 2/2020 |
| CN | 111915998 A | 11/2020 |
| CN | 112271206 A | 1/2021 |
| CN | 112767852 A | 5/2021 |
| CN | 113327958 A | 8/2021 |
| CN | 113330577 A | 8/2021 |
| JP | 2018-55815 A | 4/2018 |

DISPLAY BACK PLATE AND DISPLAY DEVICE

CROSS-REFERENCE TO RELATED APPLICATION

The present application is a U.S. National Phase Entry of International Application PCT/CN2022/090354 having an international filing date of Apr. 29, 2022, and entitled "Display Back Plate and Display Device". The entire contents of the above-identified applications are hereby incorporated by reference.

TECHNICAL FIELD

The present disclosure relates to, but is not limited to, the field of display technology, and more particularly, to a display back plate and a display device.

BACKGROUND

Semiconductor Light Emitting Diode (LED for short) technology has been under development for nearly 30 years, from an initial solid-state lighting power supply to a backlight source in the display field, and then to an LED display screen, providing a solid foundation for its wider applications. With development of chip manufacturing and encapsulation technology, Mini Light Emitting Diode (Mini LED for short) display and Micro Light Emitting Diode (Micro LED for short) display have gradually become a hot spot of display technology. The micro LED display is mainly used in fields such as Augmented Reality/Virtual Reality (AR/VR) and the mini LED display is mainly used in fields such as TV and outdoor display.

At present, LED display is gradually applied to transparent display. Transparent display is an important personalized display field of the display technology. It means that a display device itself has a certain degree of light penetrability and enables displaying of images in a transparent state, and a viewer can see not only images in the display device, but also scenes behind the display device. Transparent display may be used for outdoor display or display in open-space public places.

SUMMARY

The following is a summary of subject matter described herein in detail. The summary is not intended to limit the protection scope of claims.

In one aspect, the present disclosure provides a display back plate including multiple display units on a base substrate, wherein at least one display unit includes a pixel region configured to perform image display and a light transmissive region configured to allow light to transmit; the pixel region includes a first trace layer and a second trace layer disposed in different layers along a thickness direction of the base substrate; and the pixel region further includes a first dielectric layer and a second dielectric layer located between the first trace layer and the second trace layer, wherein, a ratio of a thickness of the first trace layer to a thickness of the second trace layer is greater than 5;

a sum of a thickness of the first dielectric layer and a thickness of the second dielectric layer is greater than 3 μm, and the thickness of the first dielectric layer is less than 2 μm;

the first trace layer includes multiple first traces, the first traces include first portions extending in a first direction; and the second trace layer includes multiple second traces, the second traces includes second portions extending in a second direction, wherein the first direction intersects with the second direction.

In an exemplary embodiment, at least one first trace includes at least one of a first scan line, a data signal line, a ground line, a first drive line, and a second drive line.

In an exemplary embodiment, a first portion of at least one first trace includes a first edge and a second edge opposite to each other in the first direction, the pixel region further includes at least one first light emitting device, at least one second light emitting device and at least one third light emitting device, orthographic projections of the at least one first light emitting device, the at least one second light emitting device and the at least one third light emitting device on the base substrate are all located in an area defined by the first edge and the second edge.

In an exemplary embodiment, the at least one first light emitting device, the at least one second light emitting device and the at least one third light emitting device are each one of a sub-millimeter light emitting diode and a micro light emitting diode.

In an exemplary embodiment, the pixel region further includes a pixel drive chip configured to provide a drive signal to at least one of the first light emitting device, the second light emitting device, and the third light emitting device.

In an exemplary embodiment, the pixel region further includes a third dielectric layer, the third dielectric layer is provided with a first groove and a second groove, the first groove is configured to print a solder paste connected to at least one of the first light emitting device, the second light emitting device and the third light emitting device, and the second groove is configured to print a solder paste connected to the pixel drive chip.

In an exemplary embodiment, a first portion of at least one first trace includes a first edge and a second edge opposite to each other in the first direction, an orthographic projection of the first portion of the at least one first trace on the base substrate is within an orthographic projection of the first dielectric layer on the base substrate, one of the first dielectric layer and the second dielectric layer has a third edge and a fourth edge opposite to each other in the first direction, the first edge and the third edge are located at a same side of the at least one first trace, the second edge and the fourth edge are located at a same side of the at least one first trace, a first perpendicular distance from the first edge to the third edge is greater than or equal to 20 μm, and a second perpendicular distance from the second edge to the fourth edge is greater than or equal to 20 μm.

In an exemplary embodiment, the first dielectric layer includes a first strip-shaped area extending in the second direction, the second dielectric layer includes a second strip-shaped area extending in the second direction, an orthographic projection of the first strip-shaped area on the base substrate is within an orthographic projection of the second strip-shaped area on the base substrate, and an area of the orthographic projection of the first strip-shaped area is smaller than an area of the orthographic projection of the second strip-shaped area; or the orthographic projection of the first strip-shaped area on the base substrate coincides with the orthographic projection of the second strip-shaped area on the base substrate; or the orthographic projection of the second strip-shaped area on the base substrate is within the orthographic projection of the first strip-shaped area on the base substrate, and the area of the orthographic projection of the second strip-shaped area is smaller than the area of the orthographic projection of the first strip-shaped area.

In an exemplary embodiment, a second portion of at least one second trace includes a fifth edge and a sixth edge opposite to each other in the second direction, an orthographic projection of the second portion of the at least one second trace on the base substrate is within an orthographic projection of the first dielectric layer on the base substrate, one of the first dielectric layer and the second dielectric layer has a seventh edge and an eighth edge opposite to each other in the second direction, the fifth edge and the seventh edge are located at a same side of the second direction of the second trace, the sixth edge and the eighth edge are located at a same side of the second direction of the second trace, a third perpendicular distance from the fifth edge to the seventh edge is greater than or equal to 20 µm, and a fourth perpendicular distance from the sixth edge to the eighth edge is greater than or equal to 20 µm.

In an exemplary embodiment, the first dielectric layer includes a third strip-shaped area extending in the first direction, the second dielectric layer includes a fourth strip-shaped area extending in the first direction X, an orthographic projection of the third strip-shaped area on the base substrate is within an orthographic projection of the fourth strip-shaped area on the base substrate, and an area of the orthographic projection of the third strip-shaped area is smaller than an area of the orthographic projection of the fourth strip-shaped area; or the orthographic projection of the third strip-shaped area coincides with the orthographic projection of the fourth strip-shaped area; or the orthographic projection of the fourth strip-shaped area on the base substrate is within the orthographic projection of the third strip-shaped area on the base substrate, and an area of the orthographic projection of the fourth strip-shaped area is smaller than an area of the orthographic projection of the third strip-shaped area.

In an exemplary embodiment, the pixel region further includes a first light shielding layer located at a side of the first trace layer close to the base substrate and a second light shielding layer located at a side of the second trace layer away from the base substrate; the first light shielding layer includes a first light shielding pattern, and an orthographic projection of the first traces on the base substrate is at least partially overlapped with an orthographic projection of the first light shielding pattern on the base substrate; the second light shielding layer includes a second light shielding pattern, and an orthographic projection of the second traces on the base substrate is at least partially overlapped with an orthographic projection of the second light shielding pattern on the base substrate.

In an exemplary embodiment, the orthographic projection of the first traces on the base substrate is within the orthographic projection of the first light shielding pattern on the base substrate, and the orthographic projection of the second traces on the base substrate is within the orthographic projection of the second light shielding pattern on the base substrate.

In an exemplary embodiment, the orthographic projection of the first light shielding pattern on the base substrate coincides with the orthographic projection of the second light shielding pattern on the base substrate.

In an exemplary embodiment, a material of the first light shielding layer is one of black matrix and molybdenum oxide, and a material of the second light shielding layer is one of black matrix and molybdenum oxide.

In an exemplary embodiment, the material of the first light shielding layer is the black matrix, and a protective layer is disposed between the first light shielding layer and the first trace layer.

In an exemplary embodiment, a buffer layer is further disposed between the first trace layer and the first light shielding layer, the material of the first trace layer is copper, the first trace layer includes a seed layer, and the seed layer is in direct contact with the buffer layer.

In an exemplary embodiment, the material of the first light shielding layer is molybdenum oxide, the material of the first trace layer is copper, and the first trace layer is in direct contact with the first light shielding layer.

In an exemplary embodiment, both the first dielectric layer and the second dielectric layer are made of organic materials.

In an exemplary embodiment, the pixel region further includes a first inorganic layer located between the first trace layer and the first dielectric layer, a second inorganic layer located at a side of the second dielectric layer away from the base substrate, and a third inorganic layer.

In an exemplary embodiment, the pixel region further includes at least one vent hole provided in at least one of the second inorganic layer and the third inorganic layer, and an orthographic projection of the at least one vent hole on the base substrate is not overlapped with an orthographic projection of a first portion of a first trace on the base substrate or an orthographic projection of a second portion of a second trace on the base substrate.

In an exemplary embodiment, the pixel region includes multiple vent holes disposed at two sides of the first portion of the first trace along the first direction, and/or the multiple vent holes are disposed at two sides of the second portion of the second trace along the second direction.

In an exemplary embodiment, a bonding area is further included, the bonding area is located on at least one side of the display area, an orthographic projection of the bonding area on the base substrate is not overlapped with an orthographic projection of the second dielectric layer on the base substrate.

In an exemplary embodiment, a fan-out area is further included, and the fan-out area is located on at least one side of the display area. The fan-out area includes the base substrate, a first fan-out portion disposed on the base substrate, a first dielectric layer disposed at a side of the first fan-out portion away from the base substrate, a second dielectric layer disposed at a side of the first dielectric layer away from the base substrate, a second fan-out portion disposed at a side of the second dielectric layer away from the base substrate, wherein the first dielectric layer is provided with a first opening, the second fan-out portion is connected with the first fan-out portion through the first opening to form a fan-out line, the second dielectric layer is provided with a second opening, an orthographic projection of the first opening on the base substrate is located in an orthographic projection of the second opening on the base substrate, and an area of the orthographic projection of the second opening on the base substrate is larger than an area of the orthographic projection of the first opening on the base substrate.

In an exemplary embodiment, the fan-out area further includes a third dielectric layer disposed at a side of the second fan-out portion away from the base substrate, the third dielectric layer is provided with a third opening, the orthographic projection of the first opening on the base substrate is located within an orthographic projection of the third opening on the base substrate, and an area of the orthographic projection of the third opening on the base substrate is larger than the area of the orthographic projection of the first opening on the base substrate.

In another aspect, the present disclosure further provides a display device, including the aforementioned display back plate.

Other aspects will become apparent upon reading and understanding of the accompanying drawings and the detailed description.

BRIEF DESCRIPTION OF DRAWINGS

Accompanying drawings are used for providing an understanding for technical solutions of the present application and form a part of the specification, are used for explaining the technical solutions of the present application together with embodiments of the present application, and do not constitute a limitation on the technical solutions of the present application.

DETAILED DESCRIPTION

Figure 1:
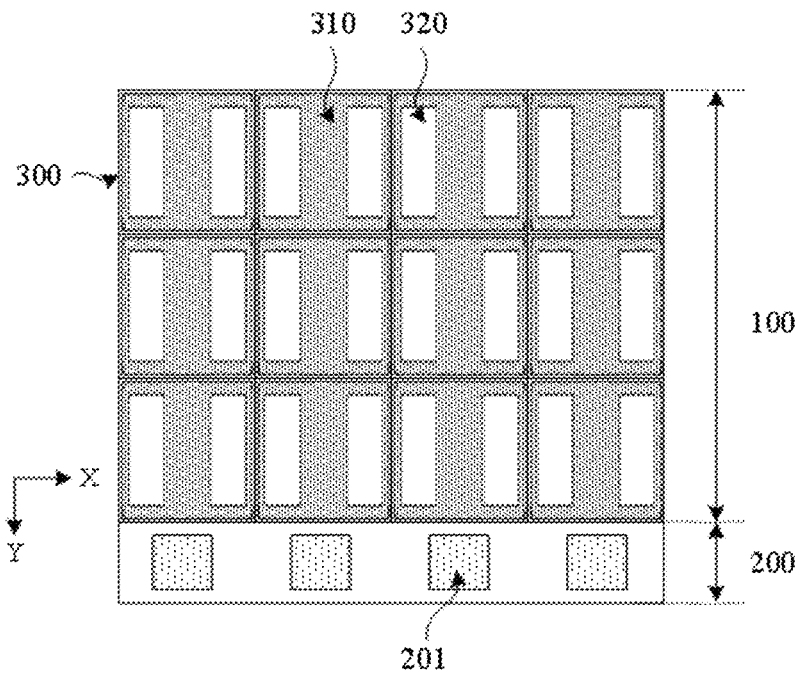
FIG. 1 is a schematic diagram of a planar structure of a display back plate according to an exemplary embodiment of the present disclosure.

To make objectives, technical solutions, and advantages of the present disclosure clearer, the embodiments of the present disclosure will be described in detail with reference to the accompanying drawings. It is to be noted that implementations may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the drawings, a size of each constituent element, a thickness of a layer, or an area is exaggerated sometimes for clarity. Therefore, one implementation of the present disclosure is not necessarily limited to the sizes, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, a detachable connection, or an integral connection. It may be a mechanical connection or an electrical connection. It may be a direct mutual connection, or an indirect connection through middleware, or internal communication between two components. Those of ordinary skills in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

At present, although the display market is dominated by Liquid Crystal Display (LCD) and Organic Light Emitting Diode (OLED) display, due to limitations in substrate size, preparation devices, processes, etc., it is difficult for LCD and OLED to implement large-size display. In contrast, Micro LED/Mini LED display may implement large-size display by splicing, which can break the size limitation. Generally, a large-size LED display panel is formed by using horizontal beam or vertical beam to fix multiple boxes in which LED display back plates are arranged, the multiple boxes splicing the multiple LED display back plates to form a large-size LED display panel. Because LEDs have the advantages such as self-luminescence, wide viewing angle, fast response, simple structure, small volume, lightness and thinness, energy saving, high efficiency, long service life, clear light, etc., a large-size LED display panel can achieve high resolution (such as Pixels Per Inch, PPI).

An LED display back plate is manufactured by miniaturization, arraying and thin filming using miniaturization process technology. Generally, a typical dimension (e.g., length) of a Micro LED may be less than 50 µm, e.g., 10 µm to 50 µm. A typical dimension (e.g., length) of a Mini LED may be about 50 µm to 150 µm, e.g., 80 µm to 120 µm. By transferring LEDs to the display back plate in batches, in cooperation with the driving design, each LED is addressable and can be individually driven to light up.

FIG. 1 is a schematic diagram of a planar structure of a display back plate according to an exemplary embodiment of the present disclosure. As shown in FIG. 1, in an exemplary implementation, the display back plate may include a display area 100 and a bonding area 200. The display area 100 is configured to perform transparent display, and the bonding area 200 may be located on at least one side of the display area 100 and is configured to be bonded to a Flexible Printed Circuit (FPC for short).

In an exemplary implementation, the display area 100 may include a base substrate and multiple display units 300 which are regularly arranged and disposed on the base substrate. At least one display unit 300 may include a pixel region 310 and a light transmissive region 320. The pixel region 310 includes a drive circuit and at least one light emitting diode disposed on the base substrate. The light emitting diode is connected to the drive circuit. The pixel region 310 is configured to perform image display. The light transmissive region 320 is located in an area other than the pixel region 310 in the display unit 300. The light transmissive region 320 is configured to allow light to transmit, so that the display unit 300 can achieve image display in a transparent state, i.e. transparent display.

In an exemplary implementation, in the display unit 300, an area of the pixel region 310 may be larger than an area of the light transmissive region 320, or the area of the pixel region 310 may be smaller than the area of the light transmissive region 320, or the area of the pixel region 310 may be equal to the area of the light transmissive region 320, which is not limited here in the present disclosure. Generally, the larger the area of the light transmissive region 320, the greater the transmittance of the display unit 300, the greater the transmittance of the display back plate, and the clearer the image seen through the display back plate.

In an exemplary implementation, the bonding area 200 may be located at a side of the display area 100 in a second direction Y, the bonding area 200 may at least include multiple sub-bonding areas 201. The multiple sub-bonding areas 201 may be arranged sequentially in a first direction X. Each sub-bonding area 201 may be provided with at least one bonding terminal, and the at least one bonding terminal is connected to the drive circuit in the display unit through a lead. The first direction X intersects with the second direction Y, for example, the first direction X is perpendicular to the second direction Y. In an exemplary implementation, the at least one bonding terminal is configured to be bonded to a flexible circuit board and connected to an external circuit through the flexible circuit board.

Figure 2:
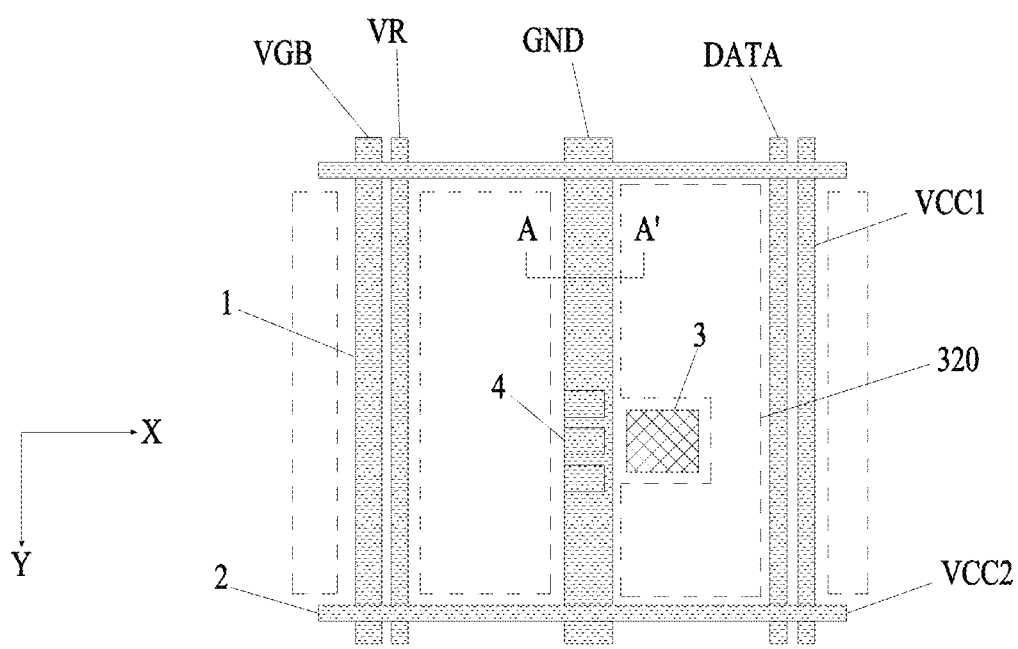
FIG. 2 is a schematic diagram of a planar structure of a display unit in a display back plate according to an exemplary embodiment of the present disclosure.

FIG. 2 is a schematic diagram of a planar structure of a display unit in a display back plate according to an exemplary embodiment of the present disclosure. As shown in FIG. 2, in an exemplary implementation, a pixel region of one display unit may include a drive circuit and a light emitting diode group 4 disposed on the base substrate. The drive circuit may include a first trace layer, a second trace layer and a pixel drive chip 3 arranged in different layers along a thickness direction of the base substrate, and the light emitting diode group 4 may include at least one first light emitting diode, at least one second light emitting diode and at least one third light emitting diode. The at least one first light emitting diode may be a red light LED emitting red light, the at least one second light emitting diode may be a blue light LED emitting blue light, and the at least one third light emitting diode may be a green light LED emitting green light.

In some embodiments, a pixel region of one display unit may include a drive circuit, a light emitting diode group and a color conversion layer sequentially stacked on the base substrate. The light emitting diode group includes multiple blue LEDs, the blue light emitted by the multiple blue LEDs can excite the color conversion layer to cause the color conversion layer to emit light with a predefined color, for example, red light and green light. A material of the color conversion layer may be quantum dots or phosphors.

In an exemplary implementation, the first trace layer may include multiple first traces 1, the first traces 1 may each include a first portion extending in the second direction Y, and the first trace 1 may include a first scan line VCC1, a data signal line DATA, a ground line GND, a first drive line VGB, and a second drive line VR. The second trace layer may include multiple second traces 2, the second traces 2 each include a second portion extending in the first direction X, and the second traces 2 may include a second scan line VCC2.

In an exemplary implementation, a second portion of the second scan line VCC2 may be located at a side of the second direction Y within the display unit. A first portion of the first drive line VGB may be located at a side of a direction opposite to the first direction X within the display unit, and a first portion of the first scan line VCC1 may be located at a side of the first direction X in the display unit. In an exemplary implementation, second portions of the two second scan lines VCC2 may be considered to define one display unit row, the first portion of the first drive line VGB and the first portion of the first scan line VCC1 define one display unit column, and the second portions of the two second scan lines VCC2 intersect with the first portion of the first drive line VGB and the first portion of the first scan line VCC1 to define one display unit.

In an exemplary implementation, the first scan line VCC1 may be connected to the second scan line VCC2 through a via. The second scan line VCC2 is configured to provide a scan signal. Since a chip terminal bonded to the pixel drive chip 3 is located at a side edge of the display unit in the second direction Y, the first scan line VCC1 is configured to turn the first scan line VCC2 extending in the first direction X to the second direction Y to facilitate connection with the chip terminal.

In an exemplary implementation, the first drive line VGB may be connected to a blue LED and a green LED respectively, and configured to provide a drive signal to the blue LED and the green LED respectively. A first portion of the second drive line VR may be located between the first portion of the first drive line VGB and a first portion of the ground line GND, and the second drive line VR may be connected to the red LED and configured to provide a drive signal to the red LED. Because luminous characteristics of the blue LED and the green LED are substantially the same, while luminous characteristics of the red LED and the blue/green LED are different, the blue LED and the green LED may be driven by one same first drive line VGB, while the red LED needs to be driven by one separate second drive line VR. In an exemplary implementation, the blue LED and the green LED may each be connected to one drive line, which is not limited here in the present disclosure.

In an exemplary implementation, a first portion of the data signal line DATA and the first portion of the ground line GND may be located between the first portion of the first drive line VGB and the first portion of the first scan line VCC1, and the pixel drive chip 3 may be located between the first portion of the data signal line DATA and the first portion of the ground line GND. The data signal line DATA is configured to provide a data signal to the pixel drive chip 3, the ground line GND is configured to provide a ground signal, the pixel drive chip 3 is configured to provide a drive signal to a first light emitting device, a second light emitting device and a third light emitting device according to the data signal provided by the data signal line DATA and under the control of the first scan line VCC1 and the second scan line VCC2, so as to control the first light emitting device, the second light emitting device, and the third light emitting device to be light up.

In an exemplary implementation, at least one first light emitting diode, at least one second light emitting diode and at least one third light emitting diode may be arranged in sequence along the second direction Y, the first portion of the first trace 1 includes a first edge and a second edge opposite in the first direction X. Orthographic projections of the at least one first light emitting diode, the at least one second light emitting diode and the at least one third light emitting diode on the base substrate are all located in an area defined by the first edge and the second edge, thus preventing the light emitting diode from occupying space of the light transmissive region 320, providing an area for the light transmissive region 320 in the display unit, and improving a light emitting quality of the light emitting diode.

In an exemplary implementation, the first portion of at least one of the ground line GND, the first scan line VCC1, the data signal line DATA, the first drive line VGB and the second drive line VR includes a first edge and a second edge opposite to each other in the first direction X. Orthographic projections of at least one first light emitting diode, at least one second light emitting diode and at least one third light emitting diode on the base substrate are located in an area defined by the first edge and the second edge. For example, the first portion of the ground wire GND includes a first edge and a second edge opposite to each other in the first direction X. Orthographic projections of at least one first light emitting diode, at least one second light emitting diode and at least one third light emitting diode on the base substrate are located within an area defined by the first edge and the second edge.

In an exemplary implementation, the at least one first light emitting diode, the at least one second light emitting diode and the at least one third light emitting diode may be one of a Mini Light Emitting Diode (Mini LED for short) and a Micro Light Emitting Diode (Micro LED for short).

In an exemplary implementation, each light emitting diode LED includes two pins (a positive pin and a negative pin), and correspondingly, connection terminals in one-to-one correspondence with the LED pins are provided in the display unit. In an exemplary implementation, the connection terminals in the display unit may include: a red positive connection terminal R+ configured to be connected to a positive pin of the red LED, a red negative connection terminal R− configured to be connected to a negative pin of the red LED, a blue positive connection terminal B+ configured to be connected to a positive pin of the blue LED, a blue negative connection terminal B− configured to be connected to a negative pin of the blue LED, a green positive connection terminal G+ configured to be connected to a positive pin of the green LED, and a green negative connection terminal G− configured to be connected to a negative pin of the green LED. In an exemplary implementation, the red positive connection terminal R+ may be connected to the second drive line VR, the blue positive connection terminal B+ may be connected to the first drive line VGB, and the green positive connection terminal G+ may be connected to the first drive line VGB.

In an exemplary implementation, the pixel drive chip 3 may include six chip pins, and correspondingly, chip terminals in one-to-one correspondence with the chip pins are provided in the display unit, which are respectively a first chip terminal, a second chip terminal, a third chip terminal, a fourth chip terminal, a fifth chip terminal and a sixth chip terminal. In an exemplary implementation, the first chip terminal may be connected to the red negative connection terminal R−, the second chip terminal may be connected to the blue negative connection terminal B−, the third chip terminal may be connected to the green negative connection terminal G−, the fourth chip terminal may be connected to the first scan line VCC1, the fifth chip terminal may be connected to the data signal line DATA, and the sixth chip terminal may be connected to the ground line GND.

In an exemplary implementation, the first scan line VCC1, the DATA signal line DATA, the ground line GND and the first drive second drive line VR may be arranged in a same layer, i.e., in the first trace layer and are formed simultaneously by a same process. Multiple connection terminals connected with the light emitting diodes, multiple chip terminals connected with the pixel driving chip 3 and the second scan line VCC2 can be arranged in a same layer, i.e., in the second trace layer and are formed simultaneously by a same process. The aforementioned connection may be direct connection or connection through a via.

In an exemplary implementation, multiple bonding terminals in the bonding area may be arranged in the second trace layer, arranged in a same layer as the multiple connection terminals and the multiple chip terminals of the display unit, and formed simultaneously by a same process.

In an exemplary implementation, there may be multiple light emitting diodes in the light emitting diode group in the display unit, e.g., 4, 5, 6, or 8 light emitting diodes, and an arrangement mode of the multiple light emitting diodes may be set according to an actual situation, which will not be limited here in the present disclosure.

In an exemplary implementation, a first width of the first drive line VGB is about 60 μm to 80 μm, for example, may be about 70 μm. A first width of the second drive line VR may be about 20 μm to 40 μm, for example, may be about 30 μm. A first width of the ground line GND may be about 180 μm to 200 μm, for example, may be about 190 μm. A first width of the data signal line DATA may be about 10 μm to 30 μm, for example, may be about 20 μm. A first width of the scan line VCC1 may be about 20 μm to 40 μm, for example, may be about 30 μm. The first width is a dimension in the first direction X.

In an exemplary implementation, a second width of the second scan line VCC2 may be about 60 μm to 80 μm, for example, may be about 70 μm. The second width is a dimension in the second direction Y.

In an exemplary implementation, a first spacing between the first drive line VGB and the second drive line VR may be about 35 μm to 55 μm, for example, may be about 45 μm. A first spacing between the data signal line DATA and the first scan line VCC1 may be about 35 μm to 55 μm, for example, may be about 45 μm. A first spacing between the second drive line VR and the ground line GND may be about 600 μm to 800 μm, for example, may be about 690 μm. A first spacing between the ground line GND and the data signal line DATA may be about 600 μm to 800 μm, for example, may be about 690 μm. A first spacing between a light emitting diode (LED) and the pixel drive chip 3 may be about 100μ to 140 μm, for example, may be about 120 μm. The first spacing is a dimension in the first direction X.

In an exemplary implementation, among the three light emitting diodes (LEDs) arranged sequentially in the second direction Y, a second spacing between adjacent light emitting diodes (LEDs) may be about 80 μm to 120 μm, for example, may be about 100 μm. The second spacing is a dimension in the second direction Y.

In an exemplary implementation, the display unit may further include a first light shielding layer located at a side of the first trace layer close to the base substrate and a second light shielding layer located at a side of the second trace layer away from the base substrate. Orthographic projections of the first light shielding layer and the second light shielding layer on the base substrate are both at least partially overlapped with an orthographic projection of the drive circuit and the light emitting diode group on the base substrate, so as to weaken a visibility of multiple signal lines and improve a display quality of the display back plate.

In an exemplary implementation, the first light shielding layer and the second light shielding layer (an area where the drive circuit and the light emitting diode group are located) in the display unit form a constituent pixel region, which is an opaque area. An area other than the first light shielding layer and the second light shielding layer is a light transmissive region 320. The area shown by the dashed line frame in FIG. 2 is the light transmissive region 320, and an area other than the dashed line frame is the area where the first light shielding layer and the second light shielding layer are located.

Figure 3:
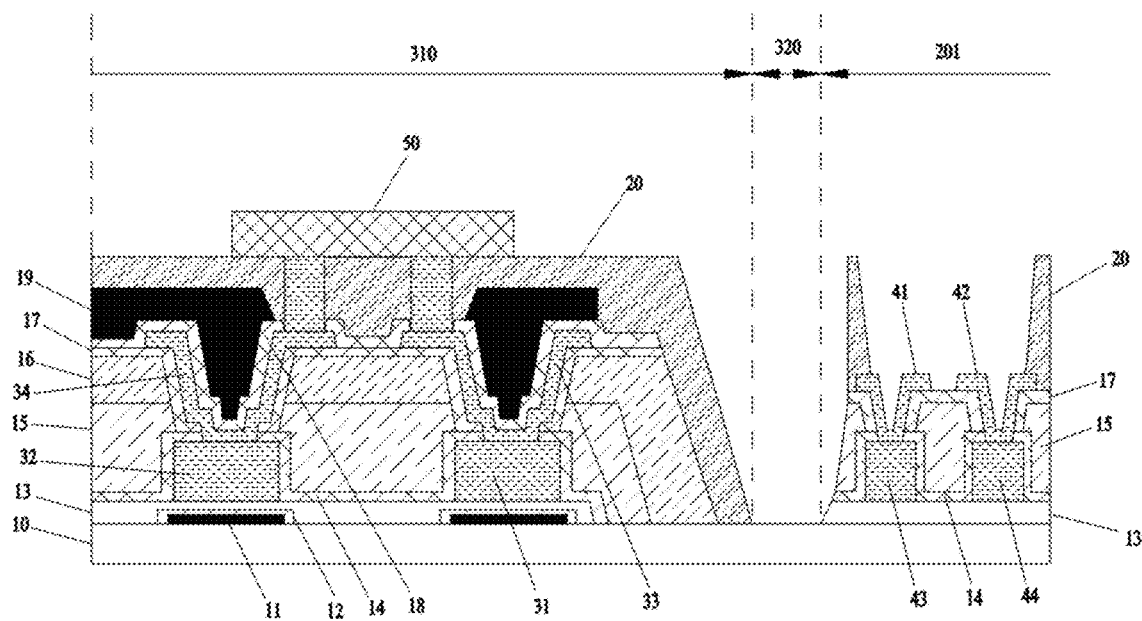
FIG. 3 is a first schematic diagram of a cross-sectional structure of a display back plate according to an exemplary embodiment of the present disclosure.

FIG. 3 is a first schematic diagram of a cross-sectional structure of a display back plate according to an exemplary embodiment of the present disclosure, and FIG. 3 illustrates cross-sectional structures of a pixel region 310 and a light transmissive region 320 in the display area and a sub-bonding area 201 in the bonding area 200. As shown in FIG. 3, in an exemplary implementation, the pixel region 310 of the display back plate may include a pixel structure layer disposed on the base substrate 10, the light transmissive region 320 of the display back plate may include an opening slot whose slot bottom is a surface of the base substrate 10, and the sub-bonding area 201 of the display back plate may include a bonding structure layer disposed on the base substrate 10.

In an exemplary implementation, the pixel structure layer of the pixel region 310 may include: a first light shielding layer which includes a third light shielding pattern 11 and is disposed on the base substrate 10; a protective layer 12 disposed at a side of the first light shielding layer away from the base substrate; a buffer layer 13 disposed at a side of the protective layer 12 away from the base substrate; a first trace layer which is disposed at a side of the buffer layer 13 away from the base substrate and at least includes a first electrode 31 and a second electrode 32; a first inorganic layer 14 disposed at a side of the first trace layer away from the base substrate; a first dielectric layer 15 disposed at a side of the first inorganic layer 14 away from the base substrate; a second dielectric layer 16 disposed at a side of the first dielectric layer 15 away from the base substrate; a second inorganic layer 17 disposed at a side of the second dielectric layer 16 away from the base substrate; a second trace layer which is disposed at a side of the second inorganic layer 17 away from the base substrate and at least includes a positive connection terminal 33 and a negative connection terminal 34, the positive electrode connection terminal 33 is connected to the first electrode 31 through a via, the negative electrode connection terminal 34 is connected to the second electrode 32 through a via; a third inorganic layer 18 disposed at a side of the second trace layer away from the base substrate; a second light shielding layer which is disposed at a side of the third inorganic layer 18 away from the base substrate and includes a fourth light shielding pattern 19; a third dielectric layer 20 disposed at a side of the second light shielding layer away from the base substrate; and a light emitting diode 50 disposed at a side of the third dielectric layer 20 away from the base substrate, wherein the light emitting diode 50 is connected to the positive electrode connection terminal 33 and the negative electrode connection terminal 34, respectively.

In an exemplary implementation, an orthographic projection of the third light shielding pattern 11 on the base substrate 10 is overlapped with an orthographic projection of the first electrode 31 on the base substrate 10 and an orthographic projection of the second electrode 32 on the base substrate 10, respectively. An orthographic projection of the fourth light shielding pattern 19 on the base substrate 10 is overlapped with an orthographic projection of the positive connection terminal 33 on the base substrate 10 and an orthographic projection of the negative connection terminal 34 on the base substrate 10, respectively.

In an exemplary implementation, a first groove is provided in the third dielectric layer 20, and the first groove exposes the positive connection terminal 33 and the negative connection terminal 34, the first groove is configured to print a solder paste connected to at least one of the first light emitting device, the second light emitting device and the third light emitting device, and the light emitting diode 50 is respectively connected to the positive connection terminal 33 and the negative connection terminal 34 through the first groove.

In an exemplary implementation, the pixel drive chip 3 may include multiple chip pins, and accordingly, chip terminals in one-to-one correspondence with the chip pins are provided in the display unit, and the chip terminals may be provided in the second trace layer. The third dielectric layer 20 is provided with a second groove that exposes the chip terminals, and the second groove is configured to print a solder paste connected to the pixel drive chip, and the pixel drive chip 3 is connected to the chip terminals through the second groove.

In an exemplary implementation the, pixel structure layer of the pixel region 310 is removed in the light transmissive region 320, thus improving the light transmittance of the light transmissive region 320 and improving a display effect of the display back plate.

In an exemplary implementation, the bonding structure layer of a sub-bonding area 201 may include: a buffer layer 13 disposed on the base substrate 10; a first trace layer which is disposed at a side of the buffer layer 13 away from the base substrate and at least includes a first bonding electrode 43 and a second bonding electrode 44; a first inorganic layer 14 disposed at a side of the first trace layer away from the base substrate; a first dielectric layer 15 disposed at a side of the first inorganic layer 14 away from the base substrate; a second inorganic layer 17 disposed at a side of the first dielectric layer 15 away from the base substrate; a second trace layer which is disposed at a side of the second inorganic layer 17 away from the base substrate and at least includes a first bonding terminal 41 and a second bonding terminal 42, with the first bonding terminal 41 being connected to the first bonding electrode 43 through a via and the second bonding terminal 42 being connected to the second bonding electrode 44 through a via; and a third dielectric layer 20 disposed at a side of the second trace layer away from the base substrate, wherein the third passivation layer 20 is provided with a second groove exposing the first bonding terminal 41 and the second bonding terminal 42.

In an exemplary embodiment, in the pixel region 310, the first dielectric layer 15, the second dielectric layer 16, and the third dielectric layer 20 in the pixel structure layer may be made of an organic material; the buffer layer 13, the first inorganic layer 14, the second inorganic layer 17, and the third inorganic layer 18 may be made of an inorganic material, and the first trace layer and the second trace layer may be made of a conductive metal material, such as a copper material. In the sub-bonding area 201, the first dielectric layer 15 in the bonding structure layer may be made of an organic material, the buffer layer 13, the first inorganic layer 14, the second inorganic layer 17, and the third inorganic layer 18 may be made of an inorganic material, and the first trace layer and the second trace layer may be made of a conductive metal material, such as a copper material.

In an exemplary implementation, the pixel region 310 has two dielectric layers, i.e. the first dielectric layer 15 and the second dielectric layer 16. The sub-bonding area 201 has one dielectric layer, i.e. the first dielectric layer 15, an orthographic projection of the second dielectric layer 16 on the base substrate 10 is not overlapped with an orthographic projection of the bonding area on the base substrate 10, and no second dielectric layer is provided in the bonding structure layer of the sub-bonding area 201. A thickness of the dielectric layer in the sub-bonding area 201 is smaller than a thickness of the dielectric layer in the pixel region 310. In the present disclosure, by reducing the thickness of the dielectric layer of the sub-bonding area 201, a segment difference of the sub-bonding area 201 may be reduced, avoiding poor bonding caused by a relatively large segment difference, and the bonding process quality can be improved, thereby improving the yield of the display back plate.

In an exemplary implementation, the buffer layer may be made of any one or more of silicon oxide (SiOx), silicon nitride (SiNx), and silicon oxynitride (SiON), and may be in a single-layer structure or a multi-layer composite structure. For example, the buffer layer may be made of silicon nitride (SiN).

In an exemplary implementation, the first trace layer may be made of a metal material, e.g., any one or more of copper (Cu), aluminum (Al), titanium (Ti), molybdenum (Mo), chromium (Cr) and tungsten (W), or an alloy material of the above metals, e.g., aluminum neodymium alloy (AlNd) or molybdenum niobium alloy (MoNb), and may be in a single-layer structure or a multi-layer composite structure, e.g., MoNb/Cu/MoNb. For example, the first trace layer may include a first sublayer, a second sublayer and a third sublayer which are stacked. The first sublayer is disposed at a side of the buffer layer 13 away from the base substrate, the second sublayer is disposed at a side of the first sublayer away from the base substrate, and the third sublayer is disposed at a side of the second sublayer away from the base substrate. The first sublayer may be made of molybdenum niobium alloy MoNb, which is used for improving adhesion, the second sublayer may be made of copper (Cu), which is used for reducing resistance, and the third sublayer may be made of MoNb, which is used for preventing oxidation, The first sublayer, the second sublayer and the third sublayer form a MoNb/Cu/MoNb stacked structure.

In an exemplary implementation, an overall thickness of the first trace layer may be about 1.5 μm to 7 μm. According to the law of resistance, a larger cross-sectional area of the trace brings a smaller resistance, so that a relatively thick first trace layer may reduce the resistance and improve the electrical performance.

In an exemplary implementation, the base substrate may be a rigid base substrate or a flexible base substrate, the rigid base substrate may be glass or the like, and the flexible base substrate may be polyimide (PI) or the like.

In an exemplary implementation, the first inorganic layer 14, the second inorganic layer 17 and the third inorganic layer 18 may each be made of any one or more of silicon oxide (SiOx), silicon nitride (SiNx), and silicon oxynitride (SiON), and may be in a single-layer structure or a multi-layer composite structure. For example, the first inorganic layer 14 may be made of silicon nitride ($Si_3N_4$).

In an exemplary implementation, the first dielectric layer 12, the second dielectric layer 16, and the third dielectric layer 20 may be made of an organic material, such as resin or the like.

Figure 4:
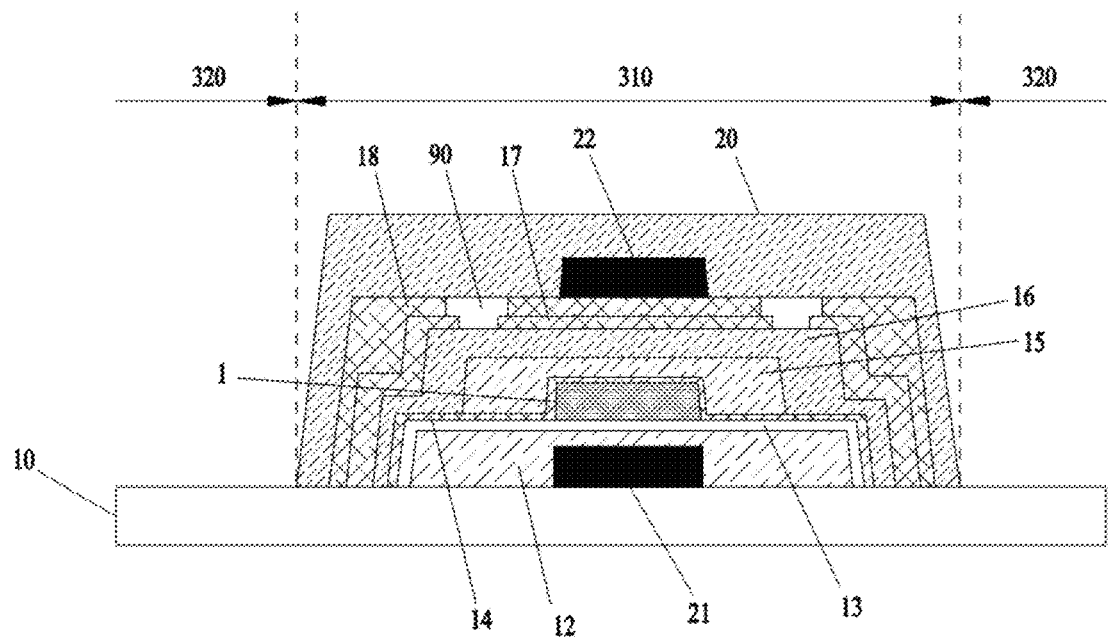
FIG. 4 is a second schematic diagram of a cross-sectional structure of a display back plate according to an exemplary embodiment of the present disclosure.

FIG. 4 is a second schematic diagram of a cross-sectional structure of a display back plate according to an exemplary embodiment of the present disclosure, FIG. 4 illustrates a cross-sectional structure of the first trace in the display area, and FIG. 4 may be a cross-sectional view taken along an A-A' direction in FIG. 2. In an exemplary implementation, as shown in FIG. 4, the pixel region 310 of the display back plate may include a trace structure layer disposed on the base substrate 10. The trace structure layer may include: a first light shielding layer which is disposed on the base substrate 10 and includes a first light shielding pattern 21; a protective layer 12 disposed at a side of the first light shielding layer away from the base substrate; a buffer layer 13 disposed at a side of the protective layer 12 away from the base substrate; a first trace layer which is disposed at a side of the buffer layer 13 away from the base substrate and at least includes multiple first traces 1; a first inorganic layer 14 disposed at a side of the first trace layer away from the base substrate; a first dielectric layer 15 disposed at a side of the first inorganic layer 14 away from the base substrate; a second dielectric layer 16 disposed at a side of the first dielectric layer 15 away from the base substrate; a second inorganic layer 17 disposed at a side of the second dielectric layer 16 away from the base substrate; a second trace layer (not shown) which is disposed at a side of the second inorganic layer 17 away from the base substrate and includes multiple second traces (not shown); a third inorganic layer 18 disposed at a side of the second trace layer away from the base substrate; a second light shielding layer which is disposed at a side of the third inorganic layer 18 away from the base substrate and includes a second light shielding pattern 22; and a third dielectric layer 20 disposed at a side of the second light shielding layer away from the base substrate.

In an exemplary implementation, a ratio of a thickness of the first trace 1 in the first trace layer to the thickness of the second trace in the second trace layer is greater than 5. For example, the thickness of the first trace 1 in the first trace layer is about 5 μm to 8 μm, and a thickness of the second trace in the second trace layer is about 0.5 μm to 1 μm.

In an exemplary implementation, a sum of a thickness of the first dielectric layer 15 and a thickness of the second dielectric layer 16 is greater than 3 μm, so as to reduce a capacitive load between the first trace 1 in the first trace layer and the second trace in the second trace layer. Since only the first dielectric layer 15 is covered on the bonding area, and the second dielectric layer 16 is not covered on the bonding area, in order to ensure a bonding effect of the bonding area, the thickness of the first dielectric layer 15 needs to be reduced, for example, the thickness of the first dielectric layer 15 is less than 2 μm, so as to avoid the occurrence of poor bonding in the bonding area due to an excessive thickness of the first dielectric layer 15.

In an exemplary implementation, an orthographic projection of the first trace 1 on the base substrate 10 is at least partially overlapped with an orthographic projection of the first light shielding pattern 21 on the base substrate 10. The first light shielding pattern 21 includes a first light shielding area extending in the first direction X and a second light shielding area extending in the second direction Y, and an orthographic projection of at least one first trace 1 on the base substrate 10 is overlapped with the second light shielding area. An orthographic projection of at least one second trace 2 on the base substrate 10 is overlapped with the first light shielding area, and the second light shielding area of the first light shielding pattern 21 is located at a side of the first trace layer close to the base substrate 10, and is configured to shield the ambient light incident into the first trace 1 through the base substrate, weaken the visibility of the first trace 1, and improve the display effect of the display back plate. The first light shielding area of the first light shielding pattern 21 is located at a side of the first trace layer close to the base substrate 10, and is configured to shield the ambient light incident into the second trace 2 through the base substrate, weaken the visibility of the second trace 2 and improve the display effect of the display back plate.

In an exemplary implementation, an orthographic projection of the second trace on the base substrate 10 is at least partially overlapped with an orthographic projection of the second light shielding pattern 22 on the base substrate 10. The second light shielding pattern 22 includes a third light shielding area extending in the first direction X and a fourth light shielding area extending in the second direction Y, an orthographic projection of at least one first trace 1 on the base substrate 10 is overlapped with the fourth light shielding area. An orthographic projection of at least one second trace 2 on the base substrate 10 is overlapped with the third light shielding area, and the fourth light shielding area of the second light shielding pattern 22 is located at a side of the second trace layer away from the base substrate 10, and is configured to shield the ambient light incident into the first trace 1, weaken the visibility of the first trace 1, and improve the display effect of the display back plate. The third light shielding area of the second light shielding pattern 22 is located at a side of the second trace layer away from the base substrate 10, and is configured to shield the ambient light incident into the second trace 2, weaken the visibility of the second trace 2, and improve the display effect of the display back plate.

In an exemplary implementation, the orthographic projection of the first trace 1 on the base substrate 10 is located within the orthographic projection of the second light shielding area of the first light shielding pattern 21 on the base substrate 10 and within an orthographic projection of the fourth light shielding area of the second light shielding pattern 22 on the base substrate 10, so that the first trace 1 is completely shielded by the first light shielding pattern 21 and the second light shielding pattern 22, thereby achieving double-sided shielding of the first trace 1.

In an exemplary implementation, the orthographic projection of the second trace 2 on the base substrate 10 is located within an orthographic projection of the first light shielding area of the first light shielding pattern 21 on the base substrate 10, and within an orthographic projection of the third light shielding area of the second light shielding pattern 22 on the base substrate 10, so that the second trace 2 is completely shielded by the first light shielding pattern 21 and the second light shielding pattern 22, thereby achieving double-sided shielding of the second trace 2.

In an exemplary implementation, the orthographic projection of the first light shielding pattern 21 on the base substrate 10 coincides with the orthographic projection of the second light shielding pattern 22 on the base substrate 10. The orthographic projection of the first light shielding area of the first light shielding pattern 21 on the base substrate 10 coincides with the orthographic projection of the third light shielding area of the second light shielding pattern 22 on the base substrate 10. The orthographic projection of the second light shielding area of the first light shielding pattern 21 on the base substrate 10 coincides with the orthographic projection of the fourth light shielding area of the second light shielding pattern 22 on the base substrate 10. In this way, the first trace 1 and the second trace 2 are both shielded from light by the first light shielding pattern 21 at a side close to the base substrate 10, and the first trace 1 and the second trace are both shielded from light by the second light shielding pattern 22 at a side away from the base substrate 10, thereby achieving double-sided shielding of the first trace and the second trace.

The first trace and the second trace will have strong reflection phenomenon under ambient light, which will affect the display effect of the display back plate. Table 1 shows a display effect of the display back plate with a single-sided light shielding layer. Table 2 shows a display effect of a display back plate with a double-sided light shielding layer according to the embodiment of the present disclosure. Table 3 shows a display effect of color gamut and reflectivity of a display back plate with a double-sided light shielding layer according to an embodiment of the present disclosure.

TABLE 1 display effect of a display back plate with a single-sided light shielding layer

| Display Unit Position | Reflectivity | Proportion of Area | Reflectivity of Display Back Plate |
|---|---|---|---|
| Transparent Area | 6.6% | 69% | 30% |
| First Trace and Second Trace | 70% | 11% | |
| Pixel Drive Chip | 90% | 20% | |

TABLE 2 display effect of a display back plate with a double-sided light shielding layer

| Display Unit Position | Reflectivity | Proportion of Area | Reflectivity of Display Back Plate |
|---|---|---|---|
| Transparent Area | 6.6% | 69% | 23% |
| First Trace and Second Trace | 6.6% | 11% | |
| Pixel Drive Chip | 90% | 20% | |

TABLE 3 display effect of color gamut and reflectivity of a display back plate with adouble-sided light shielding layer

| Design of Light Shielding Layer | Reflectivity of Display Back Plate | Contrast (ambient brightness 100 nit) | Ambient Light Gamut (ambient light brightness 100 nit) | Contrast (ambient brightness 500 nit) | Ambient Light Gamut (ambient light brightness 500 nit) |
|---|---|---|---|---|---|
| Single-sided Light Shielding Layer | 30% | 12:1 | 69% NTSC | 3:1 | 19% NTSC |
| Double-sided Light Shielding Layer | 23% | 12:1 | 72% NTSC | 3:1 | 21% NTSC |

It can be seen from Tables 1, 2 and 3 that the reflectivity of the display back plate with the single-sided light shielding layer can reach 30%, the reflectivity of the display back plate with the double-sided light shielding layer can be reduced to 23%, and the reflectivity and the color gamut of the display back plate with the double-sided light shielding layer are improved.

In an exemplary implementation, materials of both the first light shielding layer and the second light shielding layer may be one of a black matrix and molybdenum oxide.

In an exemplary implementation, the materials of the first light shielding layer and the second light shielding layer may also be other light shielding materials, preferably light shielding materials that can block visible light.

In an exemplary implementation, at least one of the first light shielding layer and the second light shielding layer may be made of amorphous silicon.

Figure 5:
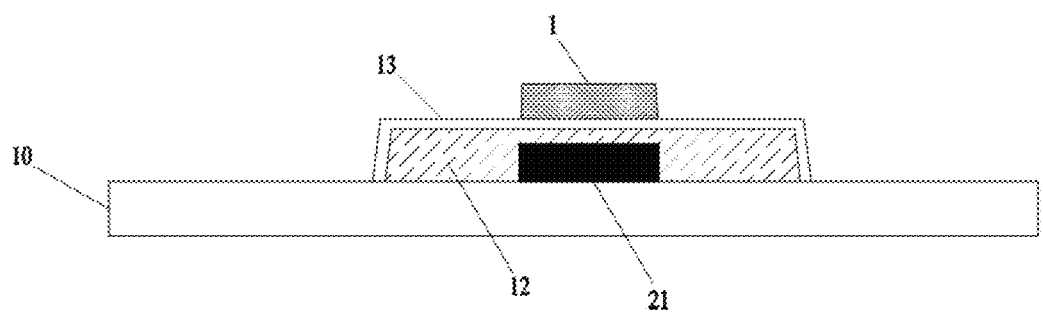
FIG. 5 is a first cross-sectional view of a first light shielding pattern in a display back plate according to an exemplary embodiment of the present disclosure.

FIG. 5 is a first cross-sectional view of a first light shielding pattern in a display back plate according to an exemplary embodiment of the present disclosure. In an exemplary implementation, as shown in FIG. 5, a black matrix may be used for a first light shielding pattern 21 of a first light shielding layer, and a protective layer 12 and a buffer layer 13 are provided between the first light shielding pattern 21 of the first light shielding layer and the first trace 1 of the first trace layer. The buffer layer 13 is located at a side of the protective layer 12 away from the base substrate 10. The first trace 1 of the first trace layer may be made of copper, the first trace 1 of the first trace layer includes a seed layer, and the seed layer of the first trace 1 of the first trace layer may be in direct contact with the buffer layer 13. The buffer layer 13 and the protective layer 12 can prevent the seed layer from falling off and ensure the stability of the black matrix. The protective layer 12 may be made of an organic material, for example, a resin.

Figure 6:
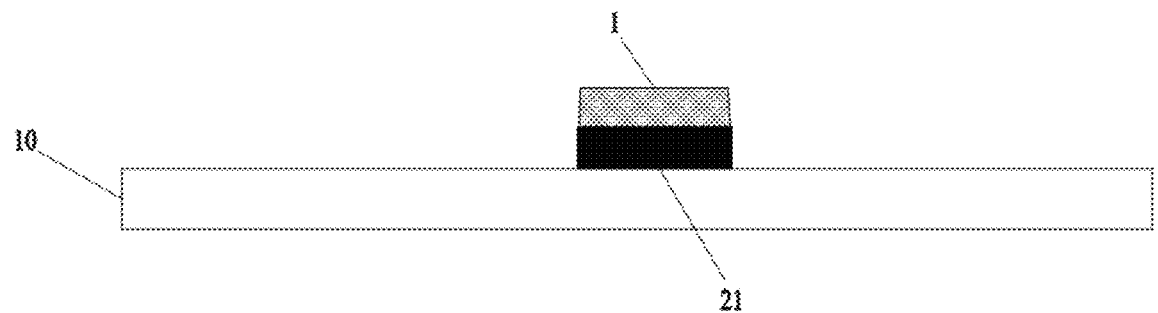
FIG. 6 is a second cross-sectional view of a first light shielding pattern in a display back plate according to an exemplary embodiment of the present disclosure.

FIG. 6 is a second cross-sectional view of a first light shielding pattern in a display back plate according to an exemplary embodiment of the present disclosure. In an exemplary implementation, as shown in FIG. 6, molybdenum oxide may be used for the first light shielding pattern 21 of the first light shielding layer. The protective layer and a buffer layer are not provided between the first light shielding pattern 21 and the first trace 1 of the first line layer, the first trace 1 may be made of copper, and the first light shielding pattern may be directly contacted with the first trace 1, thus simplifying the processes and reducing manufacturing costs.

In the exemplary implementation, as shown in FIG. 4, since there is a segment difference between the second light shielding pattern 22 and the base substrate 10 of the light transmissive region 320, and the segment difference is generally greater than 10 µm, when manufacturing the second light shielding pattern 22, a residue with large area may be easily left at the segment difference of the light transmissive region 320, which reduces the light transmittance of the light transmissive region 320 and affects the light transmittance of the display back plate. The display back plate according to an embodiment of the present disclosure increases the light transmittance of the display back plate by increasing development time of the second light shielding pattern 22, reducing the area of residual of the second light shielding pattern 22 at the segment difference of the light transmissive region 320.

Figure 7:
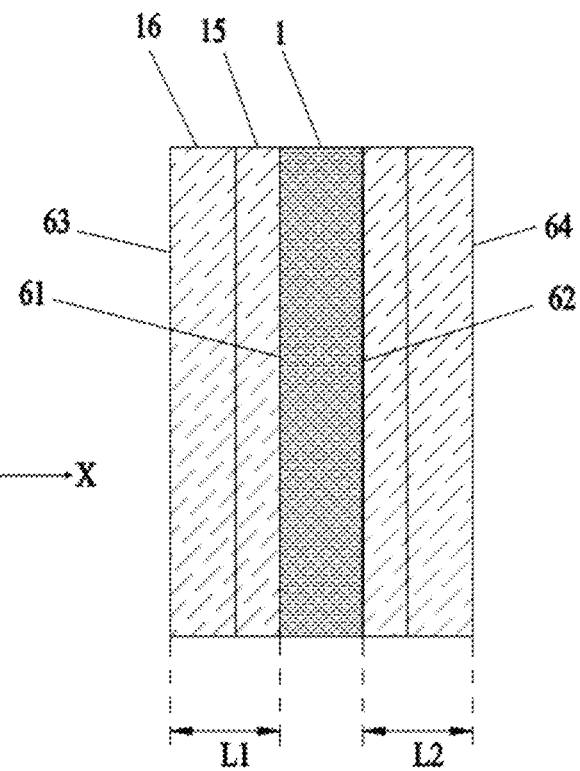
FIG. 7 is a schematic diagram of a planar structure of a first trace in a display unit according to an exemplary embodiment of the present disclosure.

FIG. 7 is a schematic diagram of a planar structure of a first trace in a display unit according to an exemplary embodiment of the present disclosure. In an exemplary implementation, as shown in FIG. 7, a first portion of at least one first trace 1 in a display unit includes a first edge 61 and a second edge 62 opposite to each other in the first direction X, and an orthographic projection of the first portion of the at least one first trace 1 on the base substrate located is within an orthographic projection of the first dielectric layer 15 on the base substrate. The orthographic projection of the first dielectric layer 15 on the base substrate is located within an orthographic projection of the second dielectric layer 16 on the base substrate. The second dielectric layer 16 has a third edge 63 and a fourth edge 64 opposite to each other in the first direction X. The first edge 61 and the third edge 63 are located at a same side of the first trace 1 in the first direction, the second edge 62 and the fourth edge 64 are located at a same side of the first trace in the first direction, a first perpendicular distance L1 from the first edge 61 to the third edge 63 is greater than or equal to 20 µm. For example, the first perpendicular distance L1 is about 20 µm to 30 µm. A second perpendicular distance L2 from the second edge 62 to the fourth edge 64 is greater than or equal to 20 µm. For example, the second perpendicular distance L2 is about 20 µm to 30 µm. The first perpendicular distance L1 and the second perpendicular distance L2 are perpendicular distances in the first direction X, respectively.

In some embodiments, the first dielectric layer has a third edge and a fourth edge opposite to each other along the first direction X, the first edge and the third edge are located at the same side of the first trace in the first direction X, the second edge and the fourth edge are locate at the same side of the first direction X of the first trace, and a first perpendicular distance L1 from the first edge to the third edge is greater than or equal to 20 µm. For example, the first perpendicular distance L1 from the first edge to the third edge is about 20 µm to 30 µm. The second perpendicular distance L2 from the second edge to the fourth edge is greater than or equal to 20 µm. For example, the second perpendicular distance L2 is about 20 µm to 30 µm. The first perpendicular distance L1 and the second perpendicular distance L2 are perpendicular distances in the first direction X, respectively.

In the display back plate according to the embodiment of the present disclosure, by forming the first perpendicular distance L1 between the first edge 61 and the third edge 63 and forming the second perpendicular distance L2 between the second edge 62 and the fourth edge 64, a segment difference between the second light shielding pattern 22 and the base substrate 10 of the light transmissive region 320 is reduced, thereby an area of residual of the second light shielding pattern 22 at the segment difference of the light transmissive region 320 is reduced and the light transmittance of the display back plate is improved.

Figure 8:
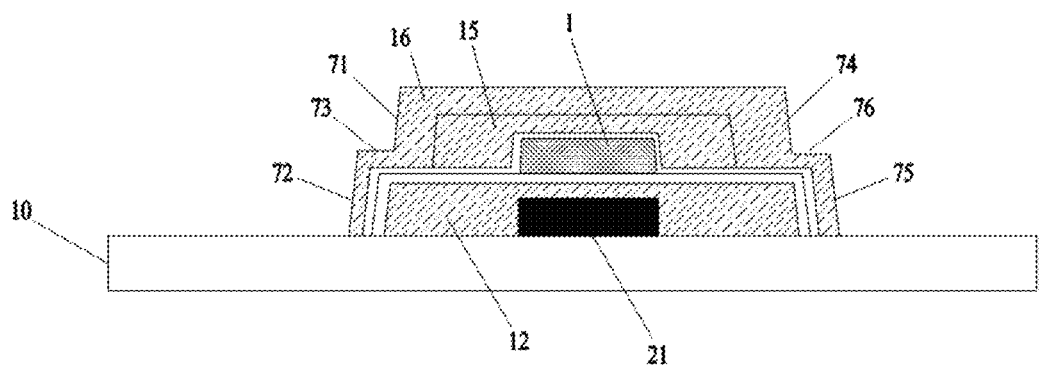
FIG. 8 is a first cross-sectional view of a first dielectric layer and a second dielectric layer in a display unit according to an exemplary embodiment of the present disclosure.

FIG. 8 is a first cross-sectional view of a first dielectric layer and a second dielectric layer in a display unit according to an exemplary embodiment of the present disclosure. In an exemplary implementation, as shown in FIG. 8, the first dielectric layer 15 includes a first strip-shaped area extending in the second direction Y, and the second dielectric layer 16 includes a second strip-shaped area extending in the second direction Y. An orthographic projection of the first strip-shaped area on the base substrate is located within an orthographic projection of the second strip-shaped area on the base substrate, and an area of the orthographic projection of the first strip-shaped area is smaller than an area of the orthographic projection of the second strip-shaped area. The second strip-shaped area includes a first sidewall and a second sidewall, the first sidewall includes a first inclined surface 71, a second inclined surface 72, and a first convex surface 73, and the first inclined surface 71 and the second inclined surface 72 are connected by the first convex surface 73. The second sidewall includes a third inclined surface 74, a fourth inclined surface 75, and a second convex surface 76, and the third inclined surface 74 and the fourth inclined surface 75 are connected by the second convex surface 76.

Figure 9:
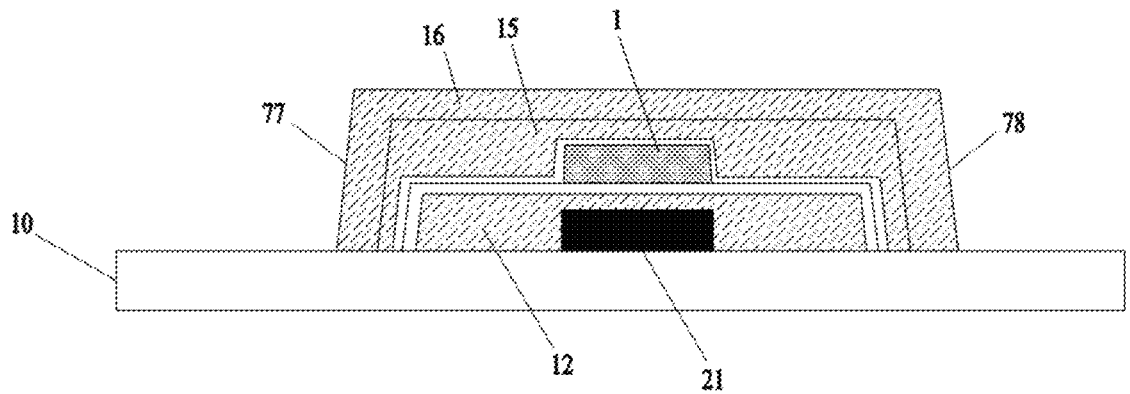
FIG. 9 is a second cross-sectional view of a first dielectric layer and a second dielectric layer in a display unit according to an exemplary embodiment of the present disclosure.

FIG. 9 is a second cross-sectional view of a first dielectric layer and a second dielectric layer in a display unit according to an exemplary embodiment of the present disclosure. In an exemplary implementation, as shown in FIG. 9, the orthographic projection of the first strip-shaped area on the base substrate is within the orthographic projection of the second strip-shaped area on the base substrate, and an area of the orthographic projection of the first strip-shaped area is smaller than an area of the orthographic projection of the second strip-shaped area. The second strip-shaped area includes a first side wall 77 and a second side wall 78, and the first side wall 77 and the second side wall 78 each have an obliquely disposed surface.

Figure 10:
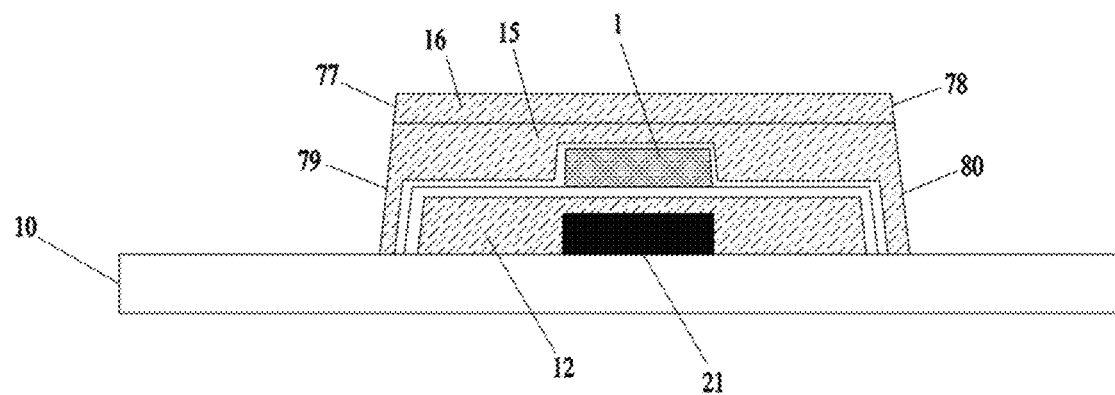
FIG. 10 is a third cross-sectional view of a first dielectric layer and a second dielectric layer in a display unit according to an exemplary embodiment of the present disclosure.

FIG. 10 is a third cross-sectional view of a first dielectric layer and a second dielectric layer in a display unit according to an exemplary embodiment of the present disclosure. In an exemplary implementation, as shown in FIG. 10, the orthographic projection of the second strip-shaped area on the base substrate is within the orthographic projection of the first strip-shaped area on the base substrate, and an area of the orthographic projection of the second strip-shaped area is smaller than an area of the orthographic projection of the first strip-shaped area. The second strip-shaped area includes a first sidewall 77 and a second sidewall 78, the first strip-shaped area includes a third side wall 79 and a fourth side wall 80. The first side wall 77 and the third side wall 79 of the first strip-shaped area are located at a same side of the first trace 1, the second side wall 78 and the fourth side wall 80 are located at a same side of the first trace 1, surfaces of the first side wall 77 and the third side wall 79 form an inclined surface, and surfaces of the second side wall 78 and the fourth side wall 80 form an inclined surface.

In some embodiments, the orthographic projection of the second strip-shaped area may also coincide with the orthographic projection of the first strip-shaped area, which is not repeated herein.

Figure 11:
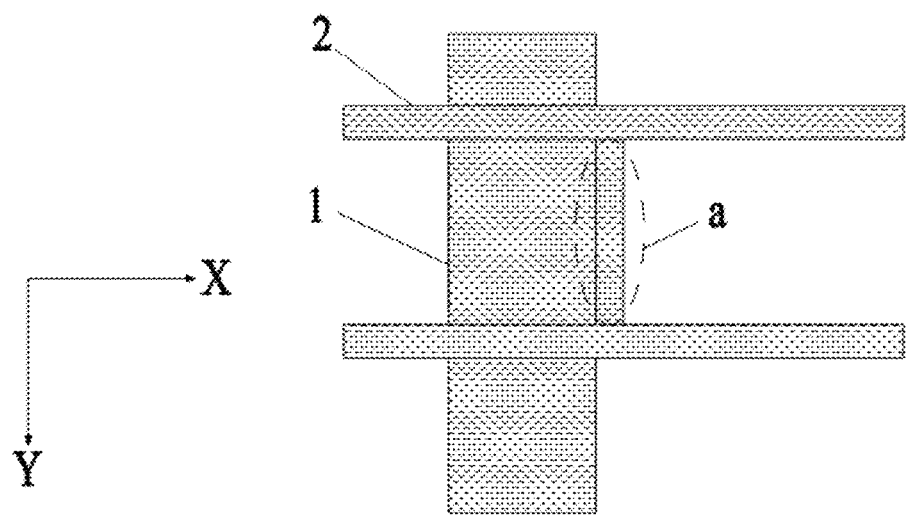
FIG. 11 is a schematic diagram of a planar structure of a first trace and a second trace in a back plate in related art.

FIG. 11 is a schematic diagram of a planar structure of a first trace and a second trace in a back plate in related art. In an exemplary implementation, as shown in FIG. 11, in the display back plate in the related art, the first trace 1 includes a first portion extending in the second direction Y, and the second trace 2 includes a second portion extending in the first direction X. Since there is a large segment difference between the second portion of the second trace 2 and the base substrate 10 of the light transmissive region 320, when manufacturing the second trace 2, it is easy for the second trace 2 to leave a residue a extending along the second direction Y at the segment difference of the light transmissive region 320, and the residue a easily causes a short circuit between adjacent second traces 2.

Figure 12:
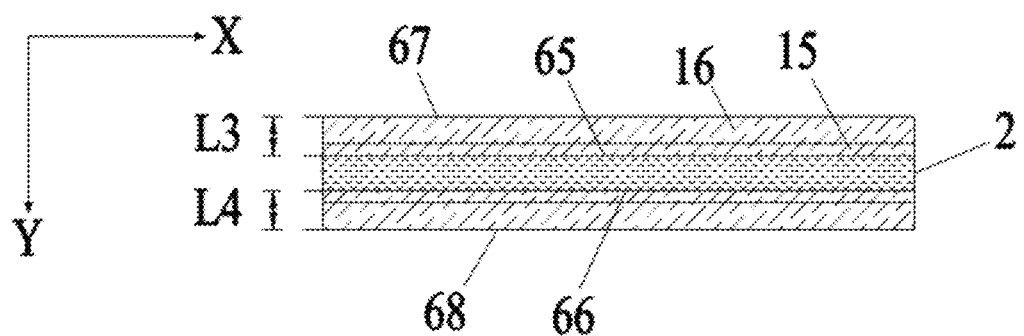
FIG. 12 is a schematic diagram of a planar structure of a second trace in a display unit according to an exemplary embodiment of the present disclosure.

FIG. 12 is a schematic diagram of a planar structure of a second trace in a display unit according to an exemplary embodiment of the present disclosure. In an exemplary implementation, as shown in FIG. 12, a second portion of at least one second trace 2 in a display unit includes a fifth edge 65 and a sixth edge 66 opposite to each other in the second direction Y, and an orthographic projection of the second portion of the at least one second trace 2 on the base substrate is within an orthographic projection of the first dielectric layer 15 on the base substrate. The orthographic projection of the first dielectric layer 15 on the base substrate is located within an orthographic projection of the second dielectric layer 16 on the base substrate. The second dielectric layer 16 has a seventh edge 67 and an eighth edge 68 opposite to each other in the second direction Y, the fifth edge 65 and the seventh edge 67 are located at a same side of the second direction Y of the second trace 2, the sixth edge 66 and the eighth edge 68 are located at a same side of the second direction Y of the second trace 2, and a third perpendicular distance L3 from the fifth edge 65 to the seventh edge 67 is greater than or equal to 20 μm. For example, the third perpendicular distance L3 is about 20 μm to 30 μm. A fourth perpendicular distance L4 from the sixth edge 66 to the eighth edge 68 is greater than or equal to 20 μm. For example, the fourth perpendicular distance L4 is about 20 μm to 30 μm. The third perpendicular distance L3 and the fourth perpendicular distance L4 are perpendicular distances in the second direction Y, respectively.

In some embodiments, the first dielectric layer has a seventh edge and an eighth edge opposite to each other in the second direction Y, the fifth edge and the seventh edge are located at a same side of the second direction Y of the second trace, the sixth edge and the eighth edge are located at a same side of the second direction Y of the second trace, and a third perpendicular distance L3 from the fifth edge to the seventh edge is greater than or equal to 20 mu m. For example, the third perpendicular distance L3 is about 20 μm to 30 μm. The fourth perpendicular distance L4 from the sixth edge to the eighth edge is greater than or equal to 20 μm. For example, the fourth perpendicular distance L4 is about 20 μm to 30 μm.

In an exemplary implementation, the first dielectric layer 15 includes a third strip-shaped area extending in the first direction X, and the second dielectric layer 16 includes a fourth strip-shaped area extending in the first direction X. An orthographic projection of the third strip-shaped area on the base substrate is within an orthographic projection of the fourth strip-shaped area on the base substrate, and an area of the orthographic projection of the third strip-shaped area is smaller than an area of the orthographic projection of the fourth strip-shaped area.

In some embodiments, the first dielectric layer includes a third strip-shaped area extending in the first direction X, and the second dielectric layer includes a fourth strip-shaped area extending in the first direction X, an orthographic projection of the third strip-shaped area coincides with an orthographic projection of the fourth strip-shaped area.

In some embodiments, the first dielectric layer includes a third strip-shaped area extending in the first direction X, and the second dielectric layer includes a fourth strip-shaped area extending in the first direction X. An orthographic projection of the fourth strip-shaped area on the base substrate is within an orthographic projection of the third strip-shaped area on the base substrate, and an area of the orthographic projection of the fourth strip-shaped area is smaller than an area of the orthographic projection of the third strip-shaped area.

In the display back plate according to the embodiment of the present disclosure, by forming the third perpendicular distance L3 between the fifth edge 65 and the seventh edge 67 and forming the fourth perpendicular distance L4 between the sixth edge 66 and the eighth edge 68, a segment difference between the second light shielding pattern 22 and the base substrate 10 of the light transmissive region 320 is reduced, thereby an area of residual of the second light shielding pattern 22 at the segment difference of the light transmissive region 320 is reduced and the light transmittance of the display back plate is improved.

Figure 13:
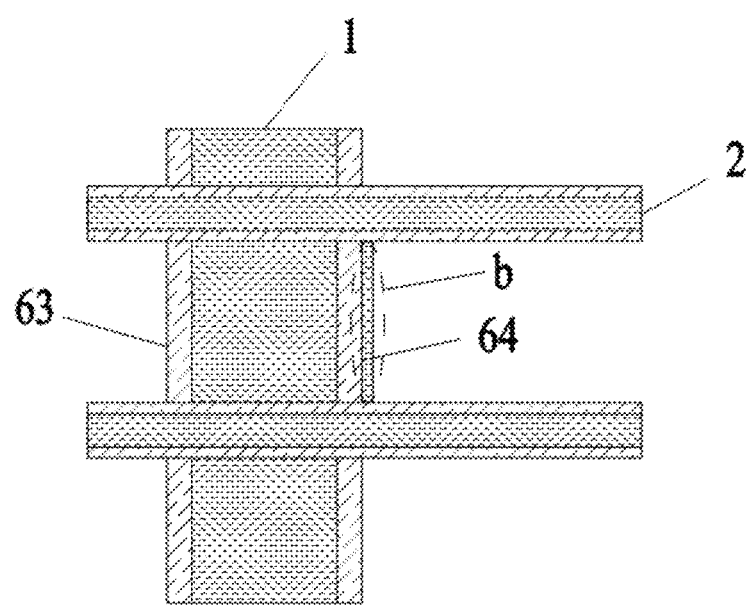
FIG. 13 is a schematic diagram of a planar structure of a first trace and a second trace in a display unit according to an exemplary embodiment of the present disclosure.

FIG. 13 is a schematic diagram of a planar structure of a first trace and a second trace in a display unit according to an exemplary embodiment of the present disclosure. As shown in FIG. 13, in a display back plate according to an embodiment of the present disclosure, when manufacturing a second trace 2, a residue b of the second trace 2 at the segment difference in the light transmissive region 320 is formed at an edge of one of the first dielectric layer 15 or the second dielectric layer 16, thereby avoiding the residue b from causing a short circuit between adjacent second traces 2.

In an exemplary implementation, as shown in FIG. 4, the pixel region of the display unit according to an exemplary embodiment of the present disclosure further includes at least one vent hole 90. The at least one vent hole 90 includes a first sub-vent hole and a second sub-vent hole, wherein the first sub-vent hole is provided in the second inorganic layer 17 and penetrates through the second inorganic layer 17 in a thickness direction of the second inorganic layer 17, the second sub-vent hole is provided in the third inorganic layer 18 and penetrates through the third inorganic layer 18 in a thickness direction of the third inorganic layer 18. An orthographic projection of one first sub-vent hole on the base substrate is at least partially overlapped with an orthographic projection of one second sub-vent hole on the base substrate to form one vent hole 90, and an area of the orthographic projection of the first sub-vent hole on the base substrate is smaller than an area of the orthographic projection of the second sub-vent hole on the base substrate.

In the display back plate according to the embodiment of the present disclosure, moisture in the organic material layer is sealed inside by the inorganic material layer because the inorganic material layer has good sealing property. In a manufacturing process of display back plate, a high temperature process will make the moisture in the organic material layer unable to be discharged. In the display back plate according to the embodiment of the present disclosure, moisture in the first dielectric layer and the second dielectric layer can be discharged through the at least one vent hole 90 to prevent occurrence of film explosion.

Figure 14:
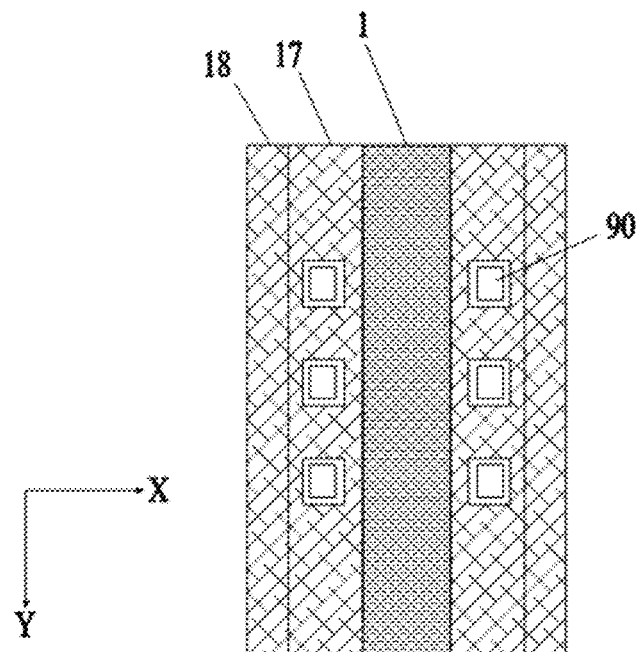
FIG. 14 is a schematic diagram of a planar structure of vent holes according to an exemplary embodiment of the present disclosure.

FIG. 14 is a schematic diagram of a planar structure of a vent hole according to an exemplary embodiment of the present disclosure. In the exemplary implementation, as shown in FIG. 14, a display unit according to an exemplary embodiment of the present disclosure includes multiple vent holes 90. The multiple vent holes 90 are provided at two sides of the first portion of the first trace 1 along the first direction X, and the multiple vent holes 90 provided at the two sides of the first portion are arranged at intervals along the second direction Y. Orthographic projections of the multiple vent hole holes 90 on the base substrate are not overlapped with the orthographic projection of the first trace 1 on the base substrate.

In an exemplary implementation, the orthographic projections of the first sub-vent hole and the second sub-vent hole of the vent holes 90 on the base substrate may be in regular or irregular shapes, such as rectangular, circular, elliptical, rhombic, polygonal, or the like.

In an exemplary implementation, the orthographic projections of the first sub-vent hole and the second sub-vent hole of the vent hole 90 on the base substrate may be rectangular. A perpendicular distance between an edge of the first sub-vent hole of the vent hole 90 at a side close to the first trace 1 and an edge of the first trace 1 in the first direction X is about 1 µm to 5 µm, for example, the perpendicular distance between the edge of the first sub-vent hole of the vent hole 90 at a side close to the first trace 1 and the edge of the first trace 1 in the first direction X is about 4 µm. A perpendicular distance between edges of the second sub-vent holes of adjacent vent holes 90 in the second direction Y is about 100 µm to 200 µm, for example, the perpendicular distance between the edges of the second sub-vent holes of the adjacent vent holes 90 in the second direction Y is about 150 µm. A perpendicular distance between two side edges of the first sub-vent hole in the vent hole 90 in the first direction X is about 5 µm to 10 µm, for example, the perpendicular distance between the two side edges of the first sub-vent hole in the vent hole 90 in the first direction X is about 9 µm. A perpendicular distance between two side edges of the second sub-vent hole in the vent hole 90 in the first direction X is about 10 µm to 20 µm, for example, the perpendicular distance between the two side edges of the second sub-vent hole in the vent hole 90 in the first direction X is about 11 µm.

In the exemplary implementation, the display unit according to the exemplary embodiment of the present disclosure includes multiple vent holes respectively provided at two sides of the second portion of the second trace along the second direction Y, and the multiple vent holes provided on the two sides of the second portion are arranged at intervals along the first direction X. Orthographic projections of the multiple vent holes on the base substrate are not overlapped with the orthographic projection of the second trace on the base substrate.

Figure 15:
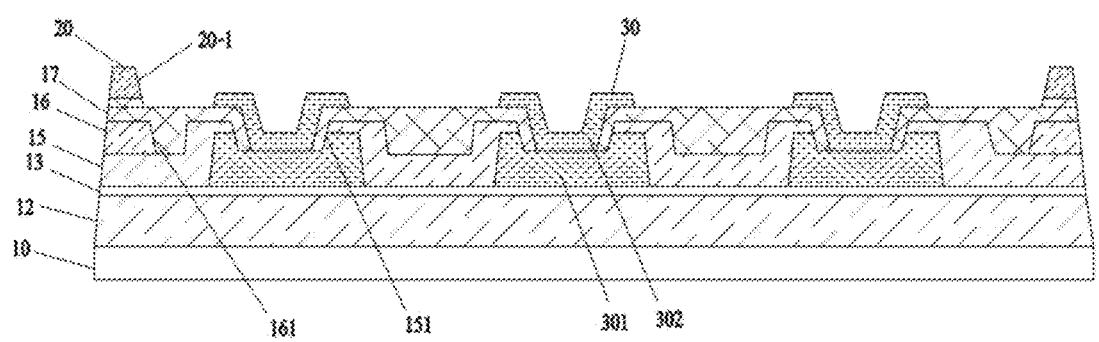
FIG. 15 is a cross-sectional view of a fan-out area in a display back plate according to an exemplary embodiment of the present disclosure.

FIG. 15 is a cross-sectional view of a fan-out area in a display back plate according to an exemplary embodiment of the present disclosure. In an exemplary implementation, as shown in FIG. 15, the display unit according to the exemplary embodiment of the present disclosure further includes a fan-out area between the display area and the bonding area. The fan-out area includes multiple fan-out lines 30, and the multiple fan-out lines 30 are configured to connect the first trace of the display area in a Fan-out tracing manner. The fan-out area includes a protective layer 12 disposed on the base substrate 10; a buffer layer 13 disposed at a side of the protective layer 12 away from the base substrate 10; a first trace layer which is disposed at a side of the buffer layer 13 away from the base substrate 10 and includes multiple first fan-out portions 301; a first dielectric layer 15 disposed at a side of the first trace layer away from the base substrate 10; a second dielectric layer 16 disposed at a side of the first dielectric layer 15 away from the base substrate 10; a second inorganic layer 17 disposed at a side of the second dielectric layer 16 away from the base substrate 10; a second trace layer which is disposed at a side of the second inorganic layer 17 away from the base substrate 10 and includes multiple second fan-out portions 302; a third dielectric layer 20 disposed at a side of the second trace layer away from the base substrate 10. Multiple first openings 151 are provided in the first dielectric layer 15, the multiple first openings 151 are in one-to-one correspondence with the multiple first fan-out portions 301, and the first openings 151 expose the corresponding first fan-out portions 301, and one second fan-out portion 302 is connected with one first fan-out portion 301 through one first opening 151 to form one fan-out line 30. The second dielectric layer 16 is provided with one second opening 161, orthographic projections of the multiple first openings 151 on the base substrate 10 are located in an orthographic projection of the second opening 161 on the base substrate 10, and an area of the orthographic projection of one second opening 161 on the base substrate 10 is larger than a sum of areas of the orthographic projections of the first openings 151 on the base substrate 10. The third dielectric layer 20 is provided one third opening 20-1, the orthographic projections of the multiple first openings 151 on the base substrate 10 is located in an orthographic projection of the third opening 20-1 on the base substrate 10, and an area of the orthographic projection of the third opening 20-1 on the base substrate 10 is larger than a sum of the areas of the orthographic projections of the multiple first openings 151 on the base substrate 10, so as to reduce a segment difference between the first fan-out portions 301 and the second fan-out portions 302 in the fan-out area.

The present disclosure further provides a display device, including the display back plate in the aforementioned exemplary embodiment. The display device may be any product or component with a display function, such as a mobile phone, a tablet computer, a television, a display, a laptop computer, a digital photo frame, or a navigator.

Although the implementations disclosed in the present disclosure are described as above, the described contents are only implementations which are used for facilitating the understanding of the present disclosure, but are not intended to limit the present disclosure. Any skilled person in the art to which the present disclosure pertains may make any modification and variation to forms and details of implementations without departing from the spirit and scope of the present disclosure. However, the patent protection scope of the present disclosure should be subject to the scope defined by the appended claims.

The invention claimed is:

1. A display back plate, comprising a display area and a bonding area, the display area comprising a plurality of display units on a base substrate, wherein at least one display unit comprises a pixel region configured to perform image display and a light transmissive region, the light transmissive region is located in an area other than the pixel region in the at least one display unit, the light transmissive region is configured to allow light to transmit, to enable the at least one display unit to implement transparent display, the pixel region comprises a first trace layer and a second trace layer disposed in different layers along a thickness direction of the base substrate; and the pixel region further comprises a first dielectric layer and a second dielectric layer located between the first trace layer and the second trace layer;

wherein a ratio of a thickness of the first trace layer to a thickness of the second trace layer is greater than 5;
a sum of a thickness of the first dielectric layer and a thickness of the second dielectric layer is greater than 3 µm, and the thickness of the first dielectric layer is less than 2 µm;
the first trace layer comprises a plurality of first traces, the plurality of first traces comprise first portions extending in a first direction; and
the second trace layer comprises a plurality of second traces, the plurality of second traces comprise second portions extending in a second direction, wherein the first direction intersects the second direction.

2. The display back plate according to claim 1, wherein at least one first trace of the plurality of first traces comprises at least one of a first scan line, a data signal line, a ground line, a first drive line, and a second drive line.

3. The display back plate according to claim 1, wherein a first portion of at least one first trace of the plurality of first traces comprises a first edge and a second edge opposite to each other in the first direction, the pixel region further comprises at least one first light emitting device, at least one second light emitting device and at least one third light emitting device, orthographic projections of the at least one first light emitting device, the at least one second light emitting device and the at least one third light emitting device on the base substrate are all located in an area defined by the first edge and the second edge.

4. The display back plate according to claim 3, wherein each of the at least one first light emitting device, the at least one second light emitting device, and the at least one third light emitting device is one of a sub-millimeter light emitting diode and a micro light emitting diode; or
the pixel region further comprises a pixel drive chip configured to provide a drive signal to at least one of the at least one first light emitting device, the at least one second light emitting device, and the at least one third light emitting device.

5. The display back plate according to claim 4, wherein the pixel region further comprises a third dielectric layer, the third dielectric layer is provided with a first groove and a second groove, the first groove is configured to print a solder paste connected to at least one of the at least one first light emitting device, the at least one second light emitting device and the at least one third light emitting device, and the second groove is configured to print a solder paste connected to the pixel drive chip.

6. The display back plate according to claim 1, wherein a first portion of at least one first trace of the plurality of first traces comprises a first edge and a second edge opposite to each other in the first direction, an orthographic projection of the first portion of the at least one first trace on the base substrate is within an orthographic projection of the first dielectric layer on the base substrate, one of the first dielectric layer and the second dielectric layer has a third edge and a fourth edge opposite to each other in the first direction, the first edge and the third edge are located at a same side of the at least one first trace, the second edge and the fourth edge are located at a same side of the at least one first trace, a first perpendicular distance from the first edge to the third edge is greater than or equal to 20 μm, and a second perpendicular distance from the second edge to the fourth edge is greater than or equal to 20 μm.

7. The display back plate according to claim 6, wherein the first dielectric layer comprises a first strip-shaped area extending in the second direction, the second dielectric layer comprises a second strip-shaped area extending in the second direction, an orthographic projection of the first strip-shaped area on the base substrate is within an orthographic projection of the second strip-shaped area on the base substrate, and an area of the orthographic projection of the first strip-shaped area is smaller than an area of the orthographic projection of the second strip-shaped area; or
the orthographic projection of the first strip-shaped area on the base substrate coincides with the orthographic projection of the second strip-shaped area on the base substrate; or
the orthographic projection of the second strip-shaped area on the base substrate is within the orthographic projection of the first strip-shaped area on the base substrate, and the area of the orthographic projection of the second strip-shaped area is smaller than the area of the orthographic projection of the first strip-shaped area.

8. The display back plate according to claim 1, wherein a second portion of at least one second trace comprises a fifth edge and a sixth edge opposite to each other in the second direction, an orthographic projection of the second portion of the at least one second trace on the base substrate is within an orthographic projection of the first dielectric layer on the base substrate, one of the first dielectric layer and the second dielectric layer has a seventh edge and an eighth edge opposite to each other in the second direction, the fifth edge and the seventh edge are located at a same side of the second direction of the second trace, the sixth edge and the eighth edge are located at a same side of the second direction of the second trace, a third perpendicular distance from the fifth edge to the seventh edge is greater than or equal to 20 μm, and a fourth perpendicular distance from the sixth edge to the eighth edge is greater than or equal to 20 μm.

9. The display back plate according to claim 8, wherein the first dielectric layer comprises third strip-shaped area extending in the first direction, the second dielectric layer comprises a fourth strip-shaped area extending in the first direction, an orthographic projection of the third strip-shaped area on the base substrate is within an orthographic projection of the fourth strip-shaped area on the base substrate, and an area of the orthographic projection of the third strip-shaped area is smaller than an area of the orthographic projection of the fourth strip-shaped area; or
the orthographic projection of the third strip-shaped area on the base substrate coincides with the orthographic projection of the fourth strip-shaped area on the base substrate; or
the orthographic projection of the fourth strip-shaped area on the base substrate is within the orthographic projection of the third strip-shaped area on the base substrate, and an area of the orthographic projection of the fourth strip-shaped area is smaller than an area of the orthographic projection of the third strip-shaped area.

10. The display back plate according to claim 1, wherein the pixel region further comprises a first light shielding layer located at a side of the first trace layer close to the base substrate and a second light shielding layer located at a side of the second trace layer away from the base substrate; the first light shielding layer comprises a first light shielding pattern, and an orthographic projection of the first traces on the base substrate is at least partially overlapped with an orthographic projection of the first light shielding pattern on the base substrate; the second light shielding layer comprises a second light shielding pattern, and an orthographic projection of the second traces on the base substrate is at least partially overlapped with an orthographic projection of the second light shielding pattern on the base substrate.

11. The display back plate according to claim 10, wherein the orthographic projection of the first traces on the base substrate is within the orthographic projection of the first light shielding pattern on the base substrate, and the orthographic projection of the second traces on the base substrate is within the orthographic projection of the second light shielding pattern on the base substrate; or
a material of the first light shielding layer is one of black matrix and molybdenum oxide, and a material of the second light shielding layer is one of black matrix and molybdenum oxide.

12. The display back plate according to claim 11, wherein the orthographic projection of the first light shielding pattern on the base substrate coincides with the orthographic projection of the second light shielding pattern on the base substrate.

13. The display back plate according to claim 11, wherein the material of the first light shielding layer is the black matrix, and a protective layer is disposed between the first light shielding layer and the first trace layer; or the material of the first light shielding layer is molybdenum oxide, the material of the first trace layer is copper, and the first trace layer is in direct contact with the first light shielding layer.

14. The display back plate according to claim 13, wherein a buffer layer is further disposed between the first trace layer and the first light shielding layer, and the first trace layer comprises a seed layer in direct contact with the buffer layer.

15. The display back plate according to claim 1, wherein the first dielectric layer and the second dielectric layer are both made of organic materials.

16. The display back plate according to claim 15, wherein the pixel region further comprises a first inorganic layer between the first trace layer and the first dielectric layer, a second inorganic layer at a side of the second dielectric layer away from the base substrate, and a third inorganic layer.

17. The display back plate according to claim 16, wherein the pixel region further comprises at least one vent hole provided in at least one of the second inorganic layer and the third inorganic layer, and an orthographic projection of the at least one vent hole on the base substrate is not overlapped with an orthographic projection of the first portions of the first traces on the base substrate or an orthographic projection of the second portions of the second traces on the base substrate; and the pixel region comprises a plurality of vent holes disposed at two sides of a first portion of a first trace of the plurality of first traces along the first direction, and/or the plurality of vent holes are disposed at two sides of a second portion of a second trace of the plurality of second traces along the second direction.

18. The display back plate according to claim 1, wherein the bonding area is located on at least one side of the display area, and an orthographic projection of the bonding area on the base substrate is not overlapped with an orthographic projection of the second dielectric layer on the base substrate; or the display back plate further comprises a fan-out area, wherein the fan-out area is located on at least one side of the display area, the fan-out area comprises the base substrate, a first fan-out portion disposed on the base substrate; the first dielectric layer disposed at a side of the first fan-out portion away from the base substrate; the second dielectric layer disposed at a side of the first dielectric layer away from the base substrate; a second fan-out portion disposed at a side of the second dielectric layer away from the base substrate, wherein the first dielectric layer is provided with a first opening, the second fan-out portion is connected with the first fan-out portion through the first opening to form a fan-out line, the second dielectric layer is provided with a second opening, an orthographic projection of the first opening on the base substrate is located in an orthographic projection of the second opening on the base substrate, and an area of the orthographic projection of the second opening on the base substrate is larger than an area of the orthographic projection of the first opening on the base substrate.

19. The display back plate according to claim 18, wherein the fan-out area further comprises a third dielectric layer disposed at a side of the second fan-out portion away from the base substrate, the third dielectric layer is provided with a third opening, the orthographic projection of the first opening on the base substrate is located within an orthographic projection of the third opening on the base substrate, and an area of the orthographic projection of the third opening on the base substrate is larger than the area of the orthographic projection of the first opening on the base substrate.

20. A display device, comprising the display back plate according to claim 1.

* * * * *